United States Patent
Shinkai

(10) Patent No.: US 9,263,381 B2
(45) Date of Patent: Feb. 16, 2016

(54) SEMICONDUCTOR MODULE AND METHOD FOR MANUFACTURING THE SAME

(71) Applicant: Sumitomo Electric Industries, Ltd., Osaka-shi (JP)

(72) Inventor: Jiro Shinkai, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 276 days.

(21) Appl. No.: 13/901,173

(22) Filed: May 23, 2013

(65) Prior Publication Data

US 2013/0322025 A1     Dec. 5, 2013

Related U.S. Application Data

(60) Provisional application No. 61/654,541, filed on Jun. 1, 2012.

(30) Foreign Application Priority Data

Jun. 1, 2012    (JP) ................................. 2012-125822

(51) Int. Cl.
    *H05K 7/00*       (2006.01)
    *H01L 23/50*      (2006.01)
    (Continued)

(52) U.S. Cl.
    CPC .............. *H01L 23/50* (2013.01); *H01L 23/053* (2013.01); *H01L 25/50* (2013.01); *H01L 23/373* (2013.01); *H01L 23/4006* (2013.01); *H01L 24/48* (2013.01); *H01L 24/49* (2013.01); *H01L 24/73* (2013.01); *H01L 24/85* (2013.01); *H01L 25/072* (2013.01);

(Continued)

(58) Field of Classification Search
    USPC ........................... 361/611, 624, 728–736, 775
    See application file for complete search history.

(56) References Cited

U.S. PATENT DOCUMENTS 6,509,629 B2 *   1/2003   Yoshimatsu et al. .......... 257/660
6,979,843 B2 *   12/2005   Nakajima et al. ............. 257/182

(Continued)

FOREIGN PATENT DOCUMENTS

JP       63-240056       10/1988
JP       11-251514 A     9/1999

(Continued)

OTHER PUBLICATIONS

Extended European Search Report in European Patent Application No. 13796387.2, dated Jul. 20, 2015.
International Preliminary Report on Patentability in PCT International Application No. PCT/JP2013/063290, dated Dec. 11, 2014.

*Primary Examiner* — Bernard Rojas
(74) *Attorney, Agent, or Firm* — Venable LLP; Michael A. Sartori; Laura G. Remus

(57) ABSTRACT

A semiconductor module according to one embodiment includes a semiconductor chip, a wiring substrate, a mounting plate provided with the wiring substrate thereon, a frame body defining a case for the wiring substrate, together with the mounting plate, a bus bar extending from the case and being inserted into a side wall of the frame. The side wall has a projection. The bus bar includes a first region in the side wall, a second region extending from a first end of the first region outward from the frame, a third region extending from a second end of the first region into the frame. The third region is bent based on the shape being close to the wiring substrate of the projection. The mounting plate with the wiring substrate is attached to the frame such that the third region is in press-contact with the wiring pattern.

9 Claims, 9 Drawing Sheets

(51) Int. Cl.
*H01L 25/00* (2006.01)
*H01L 23/053* (2006.01)
*H01L 23/40* (2006.01)
*H01L 23/00* (2006.01)
*H01L 25/07* (2006.01)
*H01L 23/373* (2006.01)

(52) U.S. Cl.
CPC ............... *H01L 2224/48227* (2013.01); *H01L 2224/49175* (2013.01); *H01L 2224/73265* (2013.01); *H01L 2224/85411* (2013.01); *H01L 2224/85439* (2013.01); *H01L 2224/85444* (2013.01); *H01L 2924/1203* (2013.01); *H01L 2924/12041* (2013.01); *H01L 2924/13091* (2013.01); *H01L 2924/19107* (2013.01); *Y10T 29/49128* (2015.01)

(56) References Cited

U.S. PATENT DOCUMENTS

| | | | |
|---|---|---|---|
| 8,665,602 B2 * | 3/2014 | Matsumoto | 361/752 |
| 2001/0002051 A1 | 5/2001 | Matsumoto | |
| 2005/0035434 A1 * | 2/2005 | Fissore et al. | 257/666 |
| 2009/0250237 A1 * | 10/2009 | Akahori et al. | 174/68.2 |
| 2010/0270515 A1 | 10/2010 | Yasuda et al. | |
| 2011/0241649 A1 * | 10/2011 | Ozawa | 324/76.11 |

FOREIGN PATENT DOCUMENTS

| JP | 2001-135762 | 5/2001 |
| JP | 2006-344841 A | 12/2006 |
| WO | WO-2009/069308 A1 | 6/2009 |
| WO | WO-2011/149017 A1 | 12/2011 |

* cited by examiner

SEMICONDUCTOR MODULE AND METHOD FOR MANUFACTURING THE SAME

CROSS-REFERENCE TO RELATED APPLICATIONS

This application claims priority to Provisional Application Ser. No. 61/654,541, filed on Jun. 1, 2012 and claims the benefit of Japanese Patent Application No. 2012-125822, filed on Jun. 1, 2012, all of which are incorporated herein by reference in their entirety.

BACKGROUND

1. Field

The present invention relates to semiconductor modules and a method for manufacturing the semiconductor modules.

2. Related Background

A semiconductor module typically includes a semiconductor chip, a wiring substrate, a bus bar, and a case. The semiconductor chip is mounted on the wiring substrate. The wiring substrate has a wiring pattern formed thereon. The wiring substrate with the semiconductor chip mounted thereon is accommodated in the case. The bus bar function as extending electrodes from the wiring substrate or the semiconductor chip accommodated in the case. Such semiconductor modules are known in, for example, Japanese Unexamined Patent Application Publication No. 11-251514 and Japanese Unexamined Patent Application Publication No. 2006-344841. The bus bar of the semiconductor module described in Japanese Unexamined Patent Application Publication No. 11-251514 and Japanese Unexamined Patent Application Publication No. 2006-344841 is provided separately from the case, and one end of bus bar is soldered to the wiring pattern.

SUMMARY

The conventional bus bar, which is described above, is fixed to the wiring substrate by reflow soldering. The reflow soldering requires a tool to fix the bus bar vertically to the wiring substrate as well as a tool to hold the vertical position of the bus bar during the solder melting. This may complicate connection of bus bar.

This technical field thus has required a semiconductor module which can be readily manufactured and a method for manufacturing such a semiconductor module.

A semiconductor module according to one aspect of the present invention includes a semiconductor chip, a wiring substrate, the semiconductor chip being mounted on the wiring substrate and being electrically connected to a wiring pattern formed on a main surface of the wiring substrate, a mounting plate, the wiring substrate being mounted on the mounting plate, a frame body defining a case for accommodating the wiring substrate, together with the mounting plate, and a bus bar electrically connected to the wiring pattern, extending from the case, and being inserted into a side wall of the frame body. The side wall has a projection inwardly projecting from the frame body. The bus bar includes a first region embedded in the side wall and having a first end and a second end, the first end being opposite to the mounting plate, the second end being at a leading edge of the projection, a second region extending from the first end of the first region outward from the frame body, and a third region extending from the second end of the first region into the frame body. The third region is bent based on the shape of the projection being close to the wiring substrate when viewed from the position of the second end. The mounting plate provided with the wiring substrate thereon is attached to the frame body such that the third region is in press-contact with the wiring pattern.

In this semiconductor module, the bus bar is connected to the wiring pattern by press-contact. The bus bar is inserted into the frame body, which can prevent the bus bar from tilting and falling over. Thus a semiconductor module is readily manufactured.

In one embodiment, the mounting plate may be attached to the frame body with a resin adhesive. The contractile force of the resin adhesive during curing can further tighten the press-contact between the third region and the wiring pattern.

In one embodiment, the mounting plate may be fixed to the frame body with screws. In this case, the fastening power of the screws can further tighten the press-contact between the third region and the wiring pattern.

In one embodiment, a surface facing the wiring pattern of the third region may be roughened. This can further secure the third region to the wiring pattern.

In one embodiment, a metal layer may be formed on a part of the wiring pattern facing the third region. The material of the metal layer may be gold, silver, or tin. The third region can readily bite into the metal layer. This can further tighten the connection between the third region and the wiring pattern.

A method for manufacturing a semiconductor module according to another aspect of the present invention includes the steps of (A) preparing a frame body having a side wall provided with a bus bar inserted thereinto, the side wall of the frame body having a projection inwardly projecting from the frame body, the bus bar having (a) a first region embedded in the side wall and having a first end and a second end, the first end being close to a first opening of the frame body, the second end being at a leading edge of the projection, (b) a second region extending from the first end of the first region outward from the frame body, and (c) a third region extending from the second end of the first region into the frame body, the third region being bent based on the shape of the projection being close to a second opening opposite to a first opening when viewed from the position of the second end, and (B) attaching a mounting plate having a main surface provided with a wiring substrate having the semiconductor chip thereon to the second opening of the prepared frame body to press-contact the third region against a wiring pattern on the wiring substrate.

In the manufacturing method, the bus bar is connected to the wiring pattern by press-contact. This simplifies connection of bus bar to a wiring pattern. The bus bar is inserted into the frame body, which prevents the bus bar from tilting and falling over. This also simplifies connection of bus bar to a wiring pattern. Thus, a semiconductor module is more readily manufactured.

In one embodiment, the third region may be bent so as to have a gap between a surface being close to the second opening of the projection and the third region in the prepared frame body. In this embodiment, the third region presses down against the wiring pattern after the attachment of the mounting plate to the frame body. This can further tighten the connection between the third region and the wiring pattern.

In one embodiment, the mounting plate may be attached to the frame body with a resin adhesive. In such a case, the contractile force of the resin adhesive during curing can further tighten the press-contact between the third region and the wiring pattern.

The resin adhesive may be a thermosetting resin. The contractile force, functioning as described above, of the thermosetting resin is enhanced by thermal curing. This can further tighten the press-contact between the third region and the wiring pattern.

As mentioned above, a semiconductor module can be more readily manufactured.

DETAILED DESCRIPTION

Figure 1:
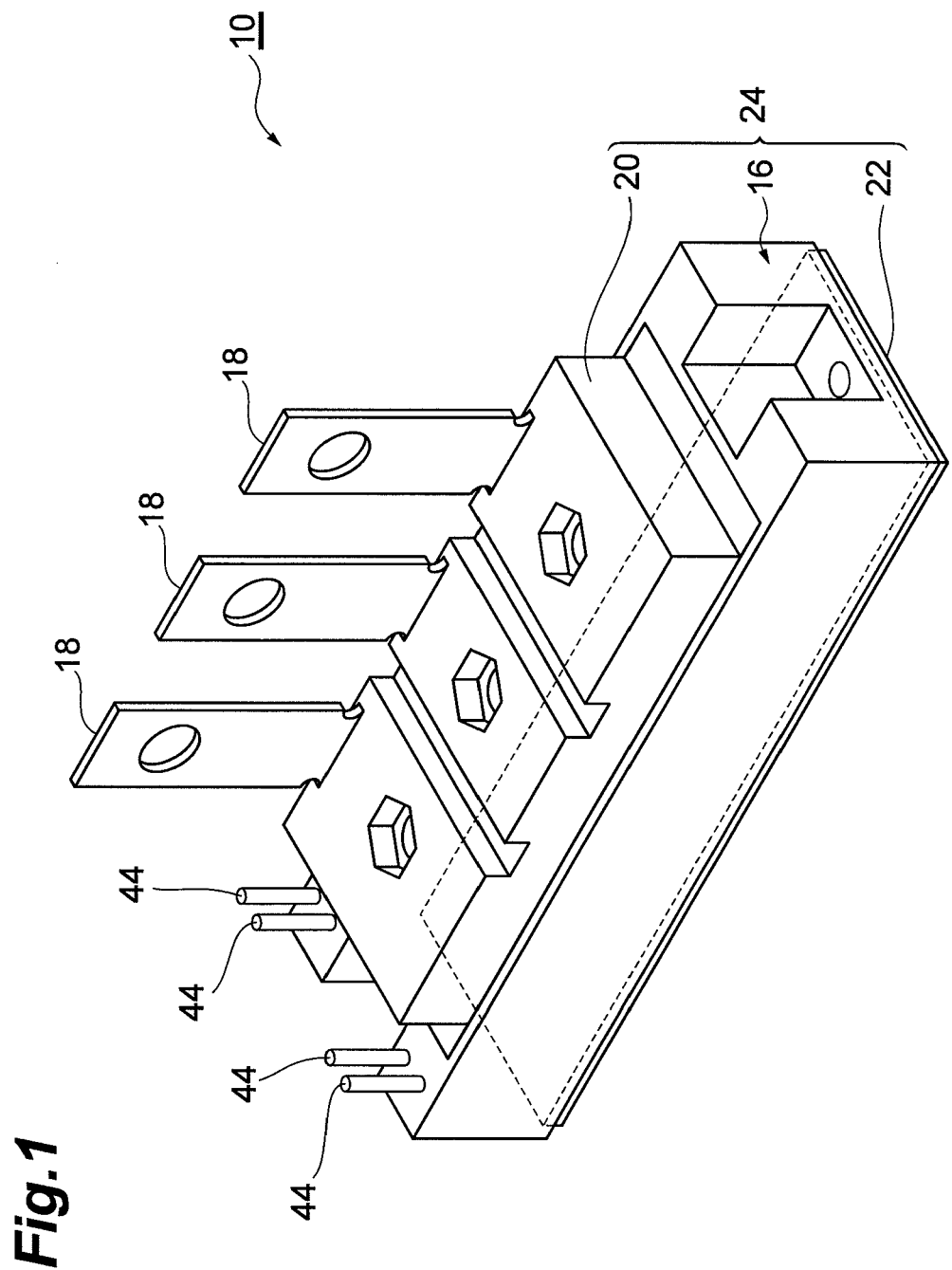
FIG. 1 is a perspective view of a semiconductor module according to one embodiment.

Embodiments of the present invention will now be described with reference to the attached drawings. In the description of the drawings, the same components are denoted by the same reference numerals without redundant description. The drawings are not necessarily represented to scale.

Figure 2:
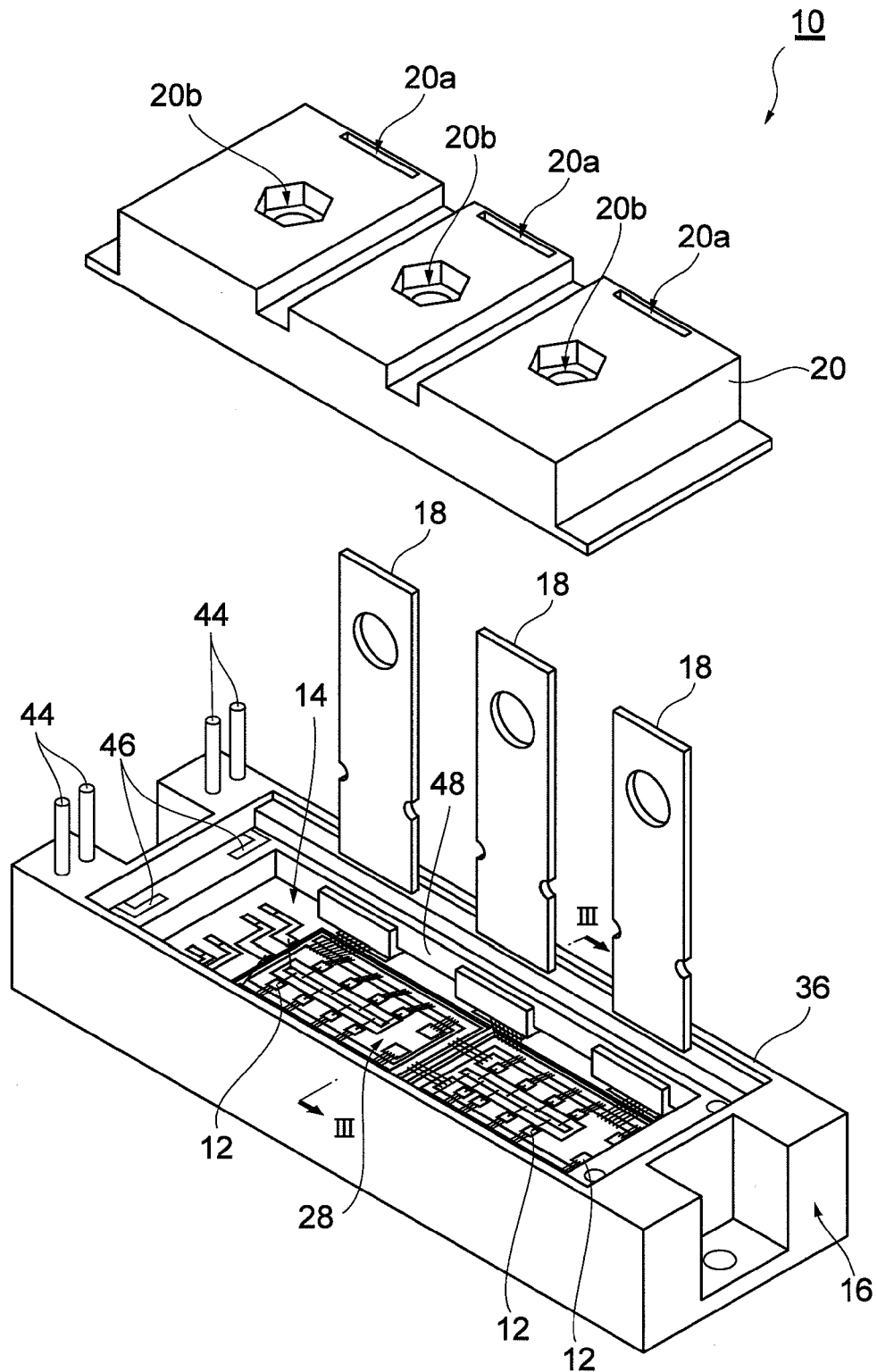
FIG. 2 is an exploded perspective view of the semiconductor module illustrated in FIG. 1, the semiconductor module being in an uncovered state.
Figure 3:
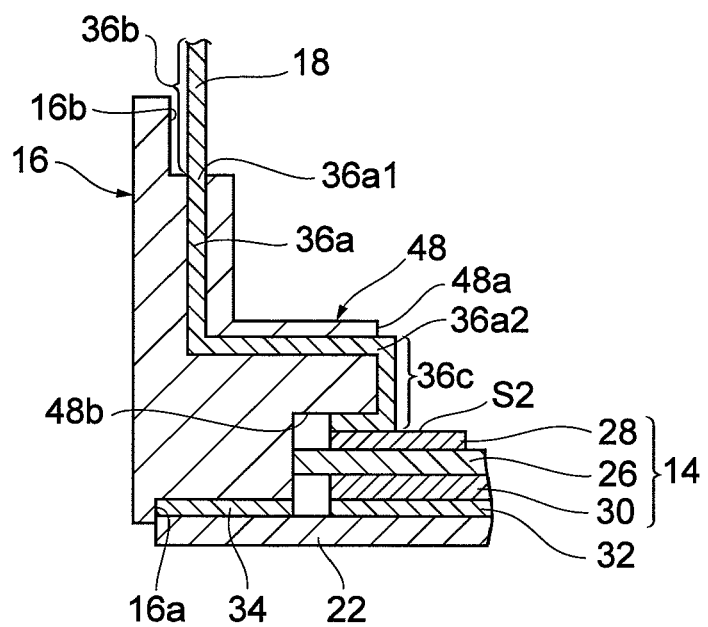
FIG. 3 is an end view taken along the line of FIG. 2.
Figure 4:
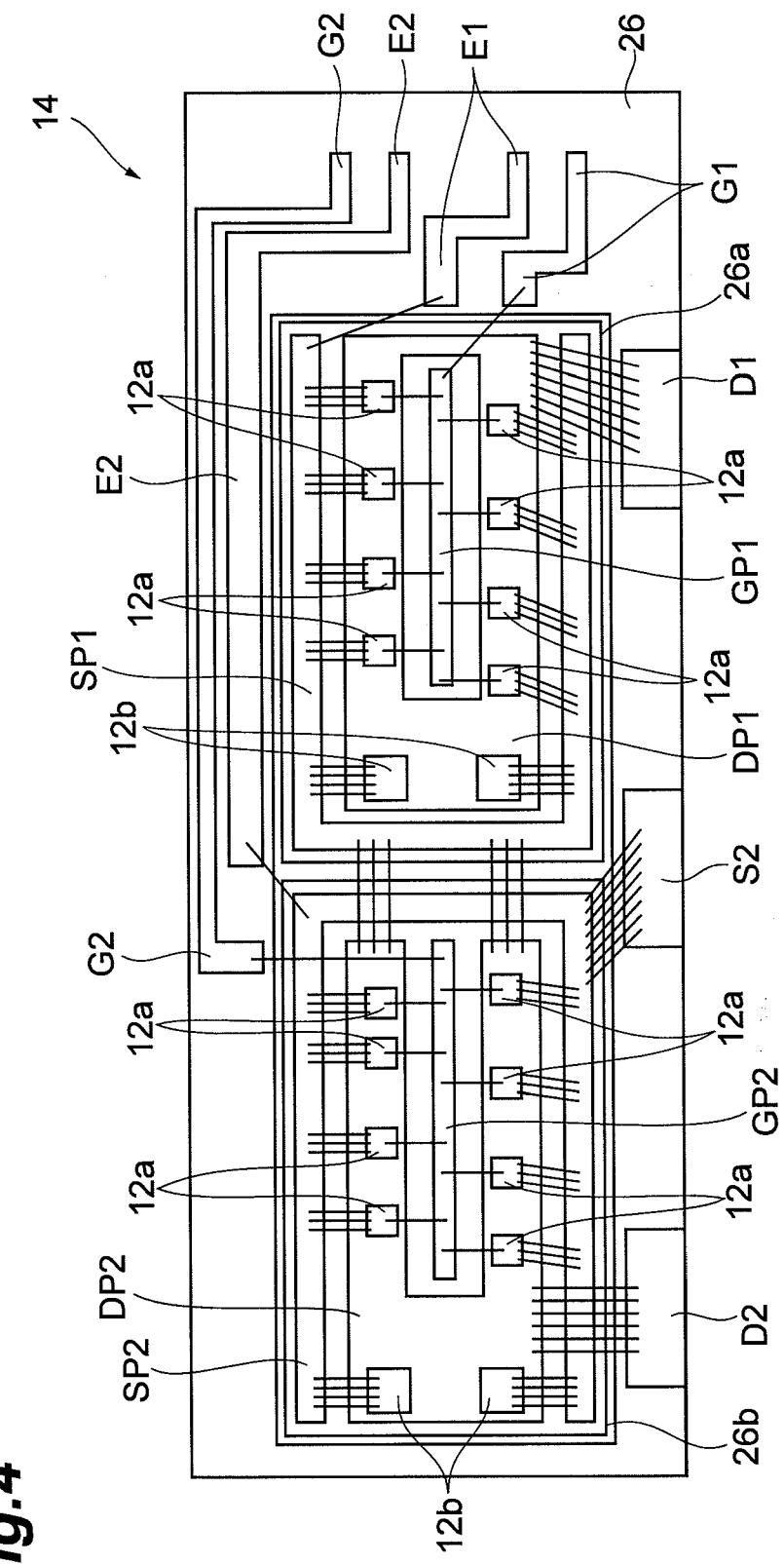
FIG. 4 is a plan view of semiconductor chips and a wiring substrate according to one embodiment.
Figure 5:
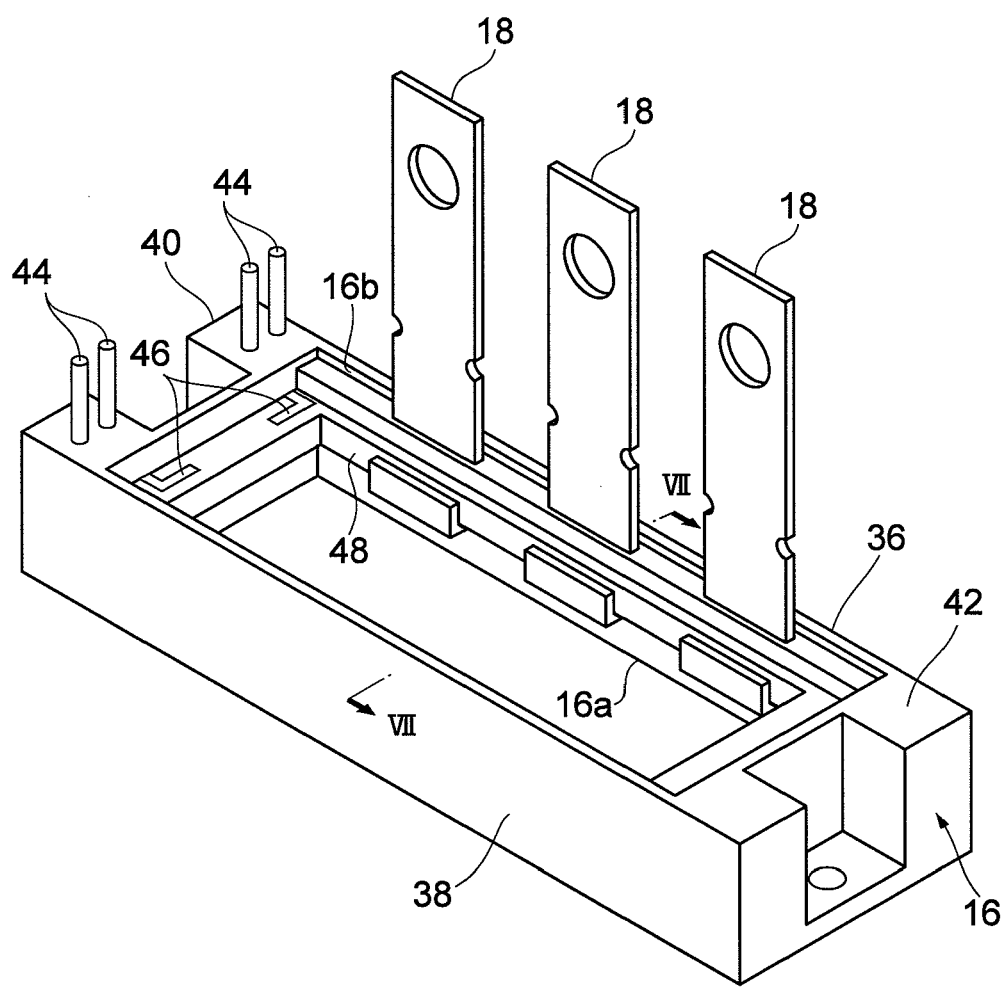
FIG. 5 is an exemplary perspective view of a frame provided with bus bars inserted thereinto.

A semiconductor module according to one embodiment will now be described with reference to FIGS. 1 to 5. FIG. 1 is a perspective view of a semiconductor module according to one embodiment. FIG. 2 is an exploded perspective view of the semiconductor module illustrated in FIG. 1, the semiconductor module being in an uncovered state. FIG. 3 is an end view taken along the line of FIG. 2. FIG. 4 is a plan view of semiconductor chips and a wiring substrate according to one embodiment. FIG. 5 is an exemplary perspective view of a frame provided with bus bars inserted thereinto.

As illustrated in FIGS. 1 to 3, a semiconductor module 10 includes one or more semiconductor chips 12, a wiring substrate 14, a frame body 16, bus bars 18, a cover 20, and a heat sink (mounting plate) 22. The frame body 16, the cover 20, and the heat sink 22 define a case 24 accommodating the wiring substrate 14. The case 24 of the semiconductor module 10 accommodates the semiconductor chips 12, which are electrically connected to the bus bars 18. The bus bars 18 extend outwardly from the case 24.

As illustrated in FIGS. 2 and 3, the one or more semiconductor chips 12 are mounted on the wiring substrate 14. The semiconductor chips 12 may be, for example, MOS-FETs or diodes. The wiring substrate 14 includes an insulating substrate 26. The insulating substrate 26 may be composed of, for example, AlN, SiN, or $Al_2O_3$. AlN and SiN have high thermal conductivity. The insulating substrate 26 composed of $Al_2O_3$ can be manufactured at low cost. SiN has thermal conductivity similar to that of Cu. Thus, if a heat sink 22, which will be described below, is composed of Cu, the reliability of the semiconductor module 10 can be improved.

A wiring pattern 28 is formed on the upper surface (main surface) of the insulating substrate 26. An example of the material of the wiring pattern 28 may be copper. The wiring pattern 28 is electrically connected to the semiconductor chips 12 via wires and so on. FIG. 4 illustrates detailed configurations of the semiconductor chips 12 and the wiring substrate 14. In FIG. 4, a plurality of MOS-FETs 12a and a plurality of diodes 12b are shown as examples of the semiconductor chips 12.

In one embodiment, the upper surface of the insulating substrate 26 may include a first substrate region 26a and a second substrate region 26b. In the first substrate region 26a, a gate pattern GP1, a source pattern SP1, and a drain pattern DP1 are provided, as the wiring pattern 28. The MOS-FETs 12a are mounted on the drain pattern DP1 such that the rear-surface drain electrodes are electrically connected to the drain pattern DP1. The gate electrodes of the MOS-FETs 12a are connected to the gate pattern GP1 via wires. The source electrodes are connected to the source pattern SP1 via other wires. The diodes 12b are mounted on the drain pattern DP1. The gate pattern GP1 is electrically connected to another gate pattern G1. The source pattern SP1 is connected to an auxiliary emitter pattern E1 via wires. The drain pattern DP1 is connected to a drain pattern D1 provided on one edge of the wiring substrate 14 via wires.

In the second substrate region 26b, a gate pattern GP2, a source pattern SP2, and a drain pattern DP2 are provided, as the wiring pattern 28. The MOS-FETs 12a are mounted on the drain pattern DP2 such that the rear-surface drain electrodes are electrically connected to the drain pattern DP2. The gate electrodes of the MOS-FETs 12a are connected to the gate pattern GP2 via wires. The source electrodes are connected to the source pattern SP2 via other wires. The diodes 12b are mounted on the drain pattern DP2. The gate pattern GP2 is electrically connected to another gate pattern G2. The source pattern SP2 is connected to an auxiliary emitter pattern E2 and a source pattern S2 provided on one edge of the wiring substrate 14 via wires. The drain pattern DP2 is connected to a drain pattern D2 provided on one edge of the wiring substrate 14 via wires.

A heat dissipation layer 30 may be provided on the lower surface of the insulating substrate 26 (see FIG. 3). An example of the material of the heat dissipation layer 30 is copper. The heat dissipation layer 30 also may be plated with nickel and so on. In the mode in which the heat dissipation layer 30 is composed of the same material as that of the wiring pattern 28, warping of the wiring substrate 14 can be reduced. The following embodiments focus on the semiconductor module 10 including the wiring substrate 14 provided with the heat dissipation layer 30, if not otherwise stated.

As illustrated in FIG. 4, the case 24 internally accommodates the wiring substrate 14 with the semiconductor chips 12 mounted thereon. In one embodiment, the case 24 may include the frame body 16, the cover 20, and the heat sink 22, as described above.

The wiring substrate 14 with the semiconductor chips 12 mounted thereon is mounted on the upper surface (main surface) of the heat sink 22. The heat dissipation layer 30 included in the wiring substrate 14 is bonded to the heat sink 22 by using solder, so that the wiring substrate 14 is fixed to the heat sink 22. In this case, a solder layer 32 is formed between the heat dissipation layer 30 and the heat sink 22. The bonding member for bonding the heat dissipation layer 30 to the heat sink 22 is not limited to solder if the heat dissipation layer 30 can be bonded to the heat sink 22. The heat sink 22 may be a metal plate. An example of the material of the heat sink 22 may be Cu.

The heat sink 22 with the wiring substrate 14 mounted thereon is attached to the frame body 16 so as to close a lower opening (second opening) 16a of the frame body 16. The heat sink 22 also functions as the bottom wall of the case 24. The heat sink 22 is bonded to the frame body 16 with a resin adhesive; hence, an adhesive layer 34 is formed between the heat sink 22 and the frame body 16. An example of the adhesive layer 34 is a thermosetting resin, and specifically epoxy- and silicone-based resins are exemplified.

The frame body 16 serves as a peripheral wall of the case 24. The frame body 16 surrounds the wiring substrate 14. As illustrated in FIG. 5, the frame body 16 includes opposite side walls 36 and 38, and connection portions 40 and 42 that connect the side walls 36 and 38.

The connection portions 40 and 42 have inwardly formed steps. The four terminals 44 for external connection extend from the connection portion 40. The four terminals 44 may be electrically connected to the gate pattern G1, the auxiliary emitter pattern E1, the auxiliary emitter pattern E2, and the gate pattern G2, respectively. To achieve the electrical connection, electrodes 46 provided on the step of the connection portion 40 and electrically connected to the terminals 44, may be connected to the gate pattern G1, the auxiliary emitter pattern E1, the auxiliary emitter pattern E2, and the gate pattern G2 via wires, for example. FIG. 2 illustrates exemplary electrodes 46 that can electrically connect the gate patterns G1 and G2 to the terminals 44 and 44.

The side wall ("a side wall") 36 has a rib (projection) 48 inwardly projecting from the frame body 16. The side wall 36 thus has an overhang, viewed from the lower opening 16a of the frame body 16 (where the heat sink 22 is attached). The rib 48 extends along the direction orthogonal to the depth direction of the case 24, the depth direction corresponding to the normal direction of the insulating substrate 26, the orthogonal direction corresponding to the longitudinal direction of the frame body 16 illustrated in FIGS. 2 and 5. In the cross-sectional view of the rib 48 taken along the plane orthogonal to the direction to which the rib 48 extends, the outline of the rib 48 may be U-shaped as illustrated in FIG. 3.

The side wall 36 on which the rib 48 is formed is integrated with three bus bars 18 inserted thereinto.

The bus bars 18 function as extending electrodes from the case 24. The bus bars 18 may be a single metal plate having conductivity. In a state where the heat sink 22 is attached to the frame body 16, the three bus bars 18 are positioned on the side wall 36, the positions of the bus bars 18 corresponding to the positions of the drain pattern D1, source pattern S2, drain pattern D2 (see FIG. 4).

As illustrated in FIG. 3, the bus bar 18 is inserted into the side wall 36 such that a part thereof is embedded in the side wall 36 and both ends thereof are exposed from the side wall 36. Hereinafter, an area of the bus bar 18 embedded in the side wall 36 is referred to as a first region 36a, an area of the bus bar 18 extending from the side wall 36 through an upper (first) opening 16b of the frame body 16 is referred to as a second region 36b, and an area of the bus bar 18 extending from the side wall 36 into the frame body 16 is referred to as third region 36c.

The first region 36a is bent so as to connect the upper end of the side wall 36 to the leading edge 48a of the rib 48. More specifically, the first region 36a extends from the upper end of the side wall 36 along the depth direction of the frame body 16, and is bent at the position of the rib 48 to extend parallel with the upper surface of the insulating substrate 26 to the leading edge 48a of the rib 48. The side view of the first region 36a (viewed from the direction of the array of the three bus bars 18) may be L-shaped as illustrated in FIG. 3. In the first region 36a, a first end 36a1 refers to a portion close to the upper opening 16b, and a second end 36a2 refers to a portion close to the leading edge 48a of the rib 48. The first region 36a connects the second region 36b to the third region 36c.

The second region 36b extends from the first end 36a1 of the first region 36a outward from the frame body 16. The end opposite to the first end 36a1 of the second region 36b thus resides outside the frame body 16.

The third region 36c extends from the second end 36a2 of the first region 36a into the frame body 16. The third region 36c is bent so as to follow the shape being close to the lower opening 16a of the rib 48. That is, the third region 36c downwardly extends from the second end 36a2 along the depth direction of the frame body 16, and is then bent at a lower corner of the rib 48 to be bent toward the lower surface 48b of the rib 48.

In the semiconductor module 10, the third region 36c has a part covering the lower surface 48b of the rib 48, the part of the rib 48 is in press-contact with the wiring pattern 28. More specifically, the third regions 36c of the three bus bars 18 are in press-contact with the corresponding drain pattern D1, source pattern S2, and drain pattern D2, respectively. The position of the rib 48 is adjusted such that the third regions 36c are in contact with the wiring pattern 28 after the attachment of the heat sink 22 to the frame body 16.

Figure 6:
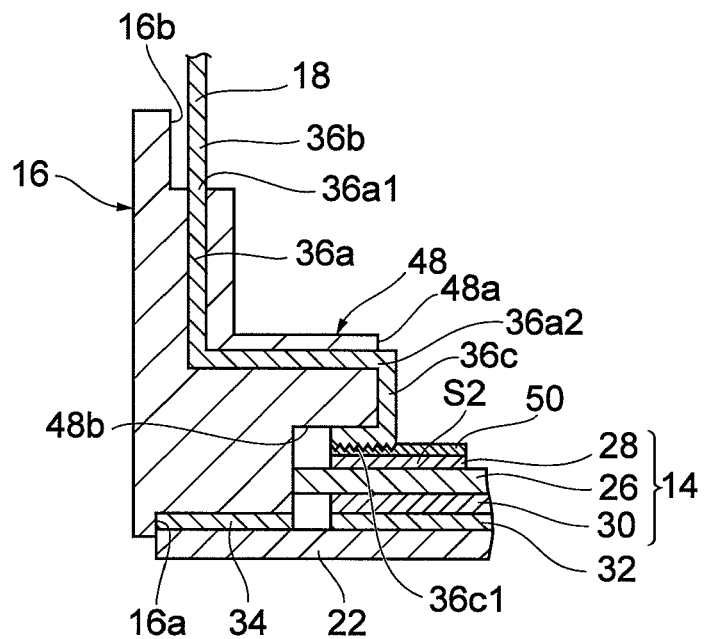
FIG. 6 is an end view of a semiconductor module according to another embodiment.

In one embodiment, a surface 36c1 facing the wiring pattern 28 (hereinafter referred to as an opposing surface) of the third region 36c may be roughened (hereinafter referred to as a rough surface), as illustrated in FIG. 6. An example of the rough surface is a satin-finished surface. The rough surface may be formed by a physical treatment such as blasting and laser beam machining, or a chemical treatment such as etching.

In one embodiment, a metal layer 50 composed of softer metal than that of the wiring pattern 28 may be formed on a part facing the third region 36c of the wiring pattern 28 (the source pattern S2 in FIG. 6), as illustrated in FIG. 6. Examples of the material of the metal layer 50 include gold, silver, or tin. Such a metal layer 50 may be formed by plating the part facing the third region 36c of the wiring pattern 28 with gold, silver, or tin.

The frame body 16 integrated with the bus bars 18 may be manufactured by molding a thermosetting resin or a thermoplastic resin, for example. Example techniques of the molding of the frame body 16 integrated with the bus bars 18 inserted thereinto include injection molding.

A cover 20 may be attached to the frame body 16 so as to close the upper opening of the frame body 16. The cover 20 has slots 20a and screw holes 20b. The slots 20a are formed in the cover 20 in order for the second region 36b of each bus bar 18 to extend therethrough. The screw holes 20b are formed in the cover 20 to fix the bus bars 18, which extend through the slots 20a and are bent so as to follow the upper surface of the cover 20, by screws. The cover 20 may be manufactured by molding a thermosetting resin or a thermoplastic resin, for example. The material of the cover 20 is typically the same material as that of the frame body 16.

An exemplary method for manufacturing a semiconductor module 10 will now be described. As illustrated in FIG. 5, a frame body 16 is prepared which is integrated with three bus bars 18 and four terminals 44 inserted thereinto. The positions of the three bus bars 18 on a side wall 36 of the frame body 16 and an exemplary method for manufacturing the frame body 16 integrated with the bus bars 18 are described in the above with reference to FIG. 3.

Figure 7:
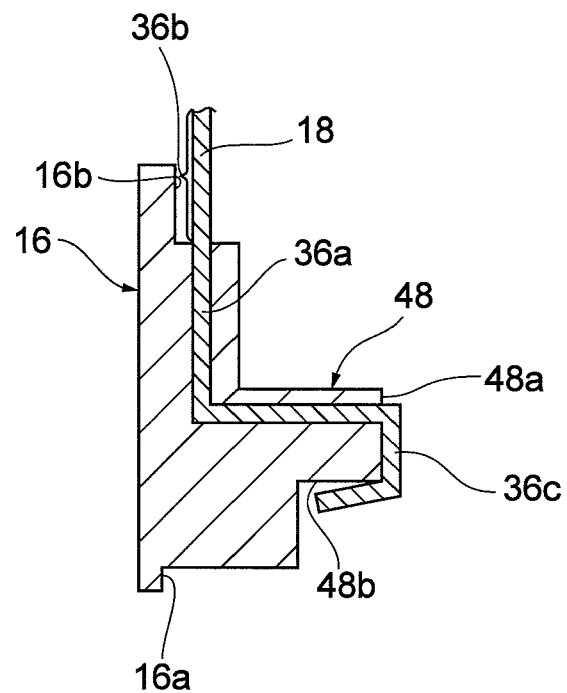
FIG. 7 is an end view taken along the line VII-VII of FIG. 5.

In one embodiment, when the frame body 16 with the bus bars is prepared, a gap may occur between the third region 36c of each bus bar 18 and the lower surface 48b of the rib 48, as illustrated in FIG. 7. In other words, the third region 36c may be bent at the lower corner of the rib 48 (a corner being close to the lower opening 16a) at a blunt angle such that the entire third region 36c is not in contact with the lower surface 48b.

Figure 8:
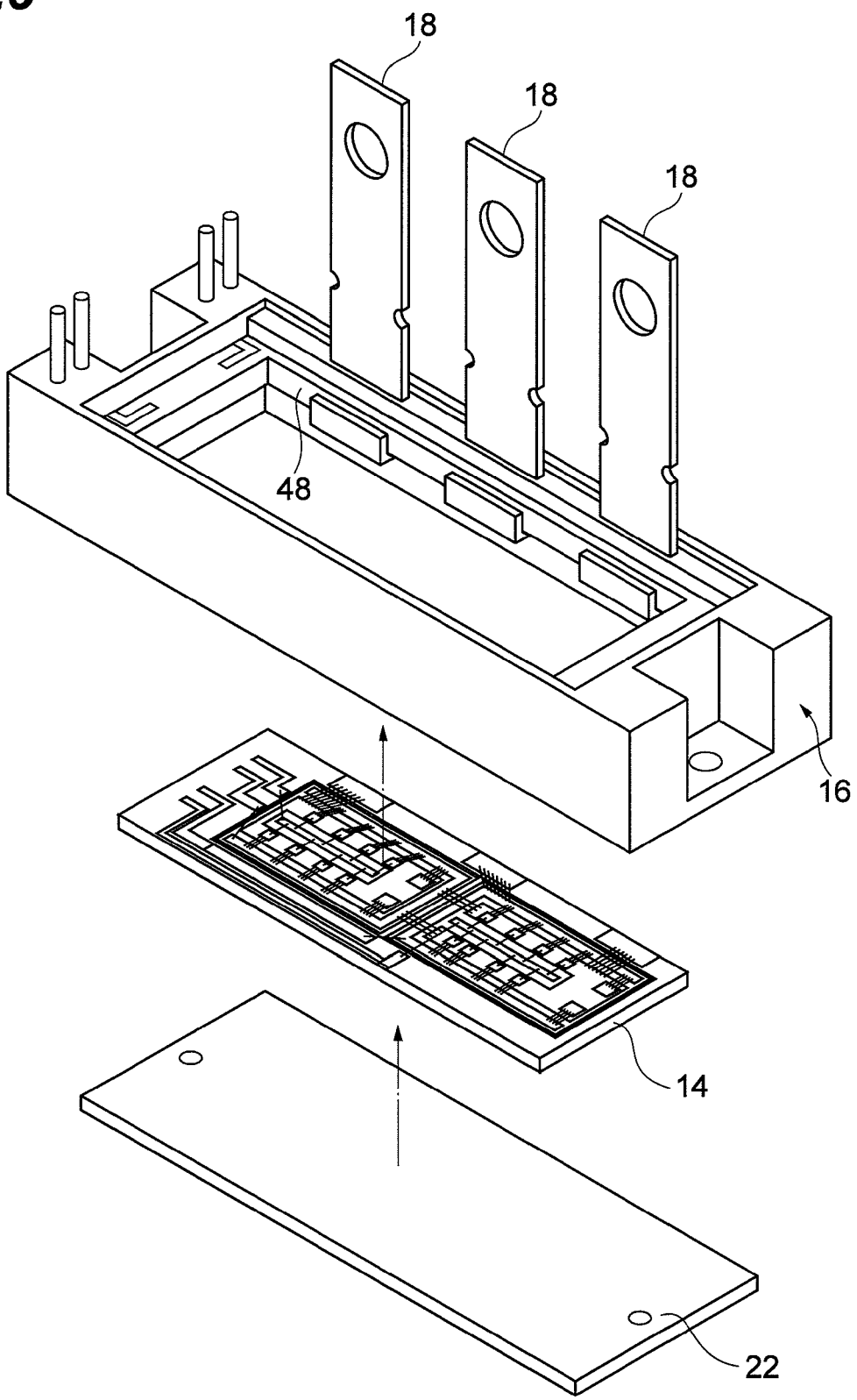
FIG. 8 illustrates a method for manufacturing a semiconductor module.

In the next step, a wiring substrate 14 with semiconductor chips 12 mounted thereon is mounted on a heat sink 22, as illustrated in FIG. 8. The heat sink 22 with the wiring substrate 14 mounted thereon is then bonded to the frame body 16 with a resin adhesive and press-contacted with the frame body 16. This press-contacts the three bus bars 18 against the wiring pattern 28 (specifically, to the drain pattern D1, the source pattern S2, and the drain pattern D2, respectively), so that they are electrically connected to each other. If the resin adhesive is a thermosetting resin, the thermosetting resin is further subjected to thermal curing.

In the next step, after implementing a predetermined wiring, such as one that uses wires to connect the terminals 44 and 44 to the gate pattern G1 and the gate pattern G2, respectively, the cover 20 is attached on the frame body 16 to complete the semiconductor module 10.

According to the semiconductor module 10 and the manufacturing method therefor in the various embodiments described above, the bus bars 18 are insert-molded into the frame body 16, and thus the bus bars 18 and the frame body 16 are integrated. This structure can prevent the bus bars 18 from tilting and falling over, and thus eliminate the need for a tool to fix the bus bars 18 for establishment of an electrical contact between the bus bars 18 and the wiring pattern 28. Accordingly, the preparation time of the tool can be saved and the manufacturing cost can be reduced.

The bus bars 18 and the wiring pattern 28 are connected by press-contact without using the connection member such as solder. This simplifies the connection of the bus bars 18 to the wiring pattern 28. Furthermore, the semiconductor module 10 and the manufacturing method therefor described above eliminate the need for application of solder paste and reflowing which are essential for soldering. Thus, the semiconductor module 10 is readily manufactured.

Additionally, if, in a semiconductor module for use in power applications, bus bars are connected to a wiring pattern by using solder, heat-cycle during the operation of the semiconductor module may lead to cracking in a solder layer between the bus bars and the wiring pattern. This may impair the reliability of the semiconductor module. However, in the semiconductor module 10, since the bus bars 18 are connected to the wiring pattern 28 by press-contact, reliability can be improved compared to the case using the solder.

In the case in which the heat sink 22 is bonded to the frame body 16 using a resin adhesive, the contractile force of the resin adhesive during curing further tightens the press-contact between the third region 36c and the wiring pattern 28. This can further tighten the connection between the third region 36c and the wiring pattern 28. If the resin adhesive is a thermosetting resin, the contractile force of the thermosetting resin is enhanced by thermal curing. This can connect the third region 36c to the wiring pattern 28 more firmly.

Furthermore, if the third region 36c has the rough opposing surface 36c1 facing the wiring pattern 28, as in the embodiment described above with reference to FIG. 6, the third region 36c barely causes the misalignment with the wiring pattern 28, and is in contact with the wiring pattern 28 in a substantially increased area. This can further secure the third region 36c to the wiring pattern 28.

If a metal layer 50 is formed on the wiring pattern 28, as in the embodiment described above with reference to FIG. 6, the third region 36c can readily bite into the metal layer 50, which is softer than the wiring pattern 28. This can further tighten the connection between the third region 36c and the wiring pattern 28.

In the mode where there is a gap between the third region 36c of the bus bar 18, which is inserted into the frame body 16, and the lower surface 48b, as illustrated in FIG. 7, the third region 36c is further bent by the wiring pattern 28 such that the gap between the rib 48 and the third region 36c is filled in when the heat sink 22 is connected to the frame body 16. The counteracting force of such bending presses down the third region 36c against the wiring pattern 28. This can further tighten the connection between the third region 36c and the wiring pattern 28.

Figure 9:
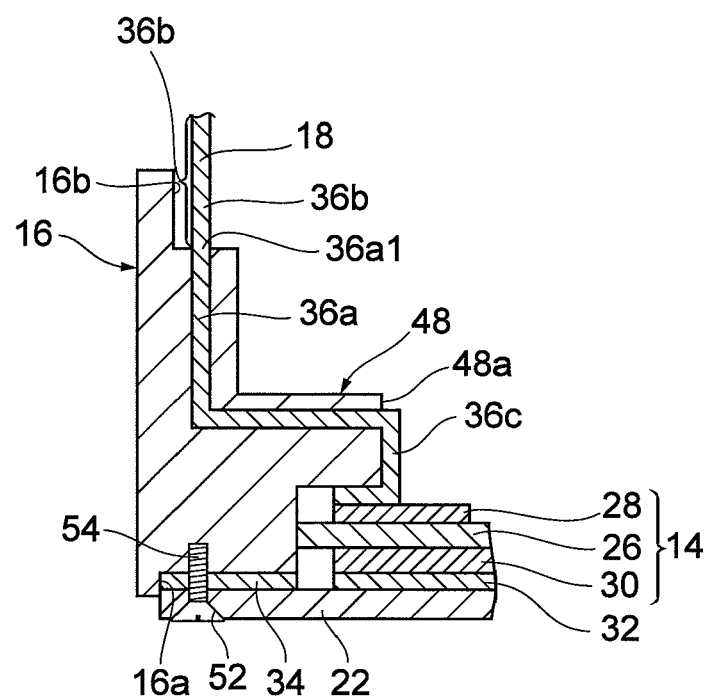
FIG. 9 is an end view of a semiconductor module according to still another embodiment.

While various embodiments of the present invention have been described above, the present invention is not limited to these embodiments, and various modifications may be made in the present invention without departing from the spirit of the invention. For example, as illustrated in FIG. 9, the heat sink 22 can be fixed to the frame body 16 with screws through screw holes 52 between the heat sink 22 and the frame body 16. In this mode, the fastening power of the screws 54 also press-contacts the third region 36c against the wiring pattern 28. This can further tighten the connection between the third region 36c and the wiring pattern 28. The depth of the screw 54 from the surface of the heat sink 22 toward the frame body 16 may be about 0.5 mm.

While FIG. 6 illustrates the embodiment including both the metal layer 50 and the rough opposing surface 36c1, the metal layer 50 can be omitted regardless of the presence of the rough opposite surface 36c1. By contraries, the metal layer 50 may be provided between the wiring pattern 28 and a flat opposite surface 36c1 of the third region 36c.

Although the number of bus bars 18 has been exemplified in the various embodiments, any other number of bus bars 18 can be employed. Although the mounting plate exemplified herein is a heat sink, any mounting plate can also be employed on which a wiring substrate can be mounted.

The exemplary embodiments described herein may be combined with each other.

The invention claimed is:

1. A semiconductor module comprising:
   a semiconductor chip;
   a wiring substrate, the semiconductor chip being mounted on the wiring substrate and being electrically connected to a wiring pattern formed on a main surface of the wiring substrate;
   a mounting plate, the wiring substrate being mounted on the mounting plate;
   a frame body defining a case for accommodating the wiring substrate, together with the mounting plate, wherein an opening passing through the frame body is formed in the frame body in a thickness direction of the wiring substrate; and
   a bus bar electrically connected to the wiring pattern, extending from the case, and being inserted into a side wall of the frame body,
   the side wall comprising a projection projecting into the opening from the frame body,
   the bus bar comprising:
     a first region embedded in the side wall and comprising a first end and a second end, the first end being opposite to the mounting plate, the second end being at a leading edge of the projection;
     a second region extending from the first end of the first region outward from the frame body; and
     a third region extending from the second end of the first region into the frame body, wherein the third region is bent based on the shape of the projection being close to the wiring substrate when viewed from the position of the second end, and the mounting plate provided with the wiring substrate thereon is attached to the frame body such that the third region is in press-contact with the wiring pattern.

2. The semiconductor module according to claim 1, wherein the mounting plate is attached to the frame body with a resin adhesive.

3. The semiconductor module according to claim 2, wherein the mounting plate is fixed to the frame body with screws.

4. The semiconductor module according to claim 1, wherein a surface facing the wiring pattern of the third region is roughened.

5. The semiconductor module according to claim 1, wherein a metal layer is formed on a part of the wiring pattern facing the third region and the material of the metal layer is gold, silver, or tin.

6. A method for manufacturing a semiconductor module, comprising the steps of:

preparing a frame body comprising a side wall provided with a bus bar inserted thereinto, wherein an opening passing through the frame body is formed in the frame body in a given direction, the side wall of the frame body comprising a projection projecting into the opening from the frame body, the bus bar comprising:

a first region embedded in the side wall and comprising a first end and a second end, the first end being close to a first opening portion of the opening in the given direction, the second end being at a leading edge of the projection;

a second region extending from the first end of the first region outward from the frame body; and a third region extending from the second end of the first region into the frame body, the third region being bent based on the shape of the projection being close to a second opening portion of the opposite to the first opening portion of the opening in the given direction when viewed from the position of the second end of the first region; and attaching a mounting plate comprising a main surface provided with a wiring substrate comprising the semiconductor chip thereon to the second opening portion of the opening of the prepared frame body to press-contact the third region against a wiring pattern on the wiring substrate.

7. The method for manufacturing the semiconductor module according to claim 6, wherein the third region is bent so as to have a gap between the surface being close to the second opening portion of the projection and the third region in the prepared frame body.

8. The method for manufacturing the semiconductor module according to claims 6, wherein the mounting plate is attached to the frame body with a resin adhesive.

9. The method for manufacturing the semiconductor module according to claim 8, wherein the resin adhesive is a thermosetting resin.

* * * * *